(12) United States Patent
Gabriel et al.

(10) Patent No.: US 7,279,429 B1
(45) Date of Patent: Oct. 9, 2007

(54) METHOD TO IMPROVE IGNITION IN PLASMA ETCHING OR PLASMA DEPOSITION STEPS

(75) Inventors: Calvin T. Gabriel, Cupertino, CA (US); Tzu-Yen Hsieh, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 58 days.

(21) Appl. No.: 10/957,340

(22) Filed: Oct. 1, 2004

(51) Int. Cl.
*H01L 21/302* (2006.01)

(52) U.S. Cl. ............... 438/719; 438/729; 438/733; 438/776; 216/71

(58) Field of Classification Search .......... 438/729, 438/733, 776, 719; 216/71
See application file for complete search history.

(56) References Cited

U.S. PATENT DOCUMENTS

| | | | |
|---|---|---|---|
| 5,789,867 A * | 8/1998 | Westendorp et al. .... | 315/111.21 |
| 5,827,437 A | 10/1998 | Yang et al. ............ | 216/77 |
| 5,895,273 A | 4/1999 | Burns et al. .......... | 438/719 |
| 6,087,267 A * | 7/2000 | Dockrey et al. ....... | 438/719 |
| 6,090,717 A | 7/2000 | Powell et al. ......... | 438/710 |
| 6,228,747 B1 | 5/2001 | Joyner ................. | 438/436 |
| 6,291,361 B1 * | 9/2001 | Hsia et al. ........... | 438/738 |
| 6,475,920 B2 | 11/2002 | Coburn et al. ........ | 438/714 |
| 6,537,918 B2 * | 3/2003 | Ionov et al. .......... | 438/710 |
| 6,635,578 B1 * | 10/2003 | Xu et al. ............. | 438/706 |
| 2003/0235987 A1 * | 12/2003 | Doshita ............... | 438/689 |
| 2004/0023508 A1 * | 2/2004 | Chinn et al. ......... | 438/710 |
| 2004/0043612 A1 * | 3/2004 | Jung ................... | 438/689 |
| 2004/0155015 A1 * | 8/2004 | Oh ..................... | 219/121.43 |
| 2004/0209480 A1 * | 10/2004 | Su et al. ............. | 438/725 |
| 2005/0029221 A1 * | 2/2005 | Chang et al. ......... | 216/2 |
| 2005/0032386 A1 * | 2/2005 | Chang et al. ......... | 438/712 |
| 2005/0048790 A1 * | 3/2005 | Komagata ............. | 438/729 |

* cited by examiner

*Primary Examiner*—Binh X. Tran
(74) *Attorney, Agent, or Firm*—Renner, Otto, Boisselle & Sklar, LLP

(57) ABSTRACT

In one embodiment, the present invention relates to a method for increasing the ignition reliability of a plasma in a plasma reactor, the method comprising: supplying a source gas to the plasma reactor, the source gas comprising: (a) at least one reactive compound; and (b) at least one ignition gas, wherein the at least one ignition gas increases the ignitability of the source gas as compared to the ignitability of the source gas lacking the at least one ignition gas.

23 Claims, 1 Drawing Sheet

METHOD TO IMPROVE IGNITION IN PLASMA ETCHING OR PLASMA DEPOSITION STEPS

FIELD OF THE INVENTION

The present invention relates to plasma etching or plasma deposition methods for use in semiconductor fabrication. More particularly, the present invention relates to methods by which to improve ignition reliability in plasma etching and/or plasma deposition steps in semiconductor fabrication.

BACKGROUND OF THE INVENTION

During the formation of semiconductor devices, such as dynamic random access memories (DRAMs), static random access memories (SRAMs), microprocessors, etc., various layers are subject to either plasma etching, plasma deposition or both.

For example, insulating layers, such as silicon dioxide, phosphorous doped silicon dioxide, or other doped oxide, are used to electrically separate conductive layers, such as doped polycrystalline silicon, doped silicon, aluminum, refractory metal silicides, etc. It is often required that the conductive layers be interconnected through holes in the insulating layer. Such holes are commonly referred to as contact holes, i.e., when the hole extends through an insulating layer to an active device area, or vias, i.e., when the hole extends through an insulating layer between two conductive layers.

As known to those of skill in the art, various etch or deposition chemistries exist. Depending upon the layer to be etched or deposited, those of skill in the art recognize which etch chemistry or deposition chemistry to utilize.

For example, it is known to utilize plasmas containing fluorocarbons or hydrofluorocarbons to etch oxides relative to underlying silicon containing layers. Plasmas containing $CF_4$ have been used to perform such an etch. In some cases, an inert gas such as argon is added to the etch chemistry. Using fluorocarbon or hydrofluorocarbon containing plasmas provides a means of selectively etching oxide films against an underlying silicon containing layer, i.e., the etching of the oxide film down to the underlying silicon layer without significantly etching the underlying silicon containing layer. In such a case, a high oxide to silicon etch rate ratio is required.

The mechanism responsible for the capability of fluorocarbons to accomplish high selectivity of silicon dioxide to silicon etch rate involves the combination of at least two phenomena. First, the deposition of nonvolatile residue, e.g., a polymeric containing residue, on various surfaces during the etching process, and second, the oxygen from the etching of the oxide in the process performs a particular role. While carbon containing residues are found to deposit on all surfaces inside an etch chamber containing fluorocarbon or hydrofluorocarbon plasmas, less accumulation is observed to occur on oxide surfaces, e.g., doped silicon dioxide, than on non-oxide surfaces, e.g., silicon containing surfaces such as silicon nitride, doped silicon, or polysilicon.

In other instances, etching of metal layers or metal containing layers needs to be accomplished. For example, metal layers in semiconductors can be formed of copper, aluminum, aluminum alloys such as Al—Cu, Al—Si, Al—Cu—Si, etc.

As is known to those of skill in the art, the various chemistries utilized to etch such insulation layers and/or metal layers, and in the plasma deposition of other materials are typically difficult to ignite reliably in a plasma etching apparatus. Thus, there exists a need for a plasma etching method which permits reliable ignition of the etch chemistry. Additionally, there exists a need in the art for a plasma deposition chemistry which ignites reliably.

SUMMARY OF THE INVENTION

In one embodiment, the present invention relates to a method for etching at least a portion of at least one layer of a semiconductor wafer to expose one or more underlying layers, the method comprising: placing a semiconductor wafer in a plasma reactor; supplying an etchant source gas to the plasma reactor, the etchant source gas comprising: (a) at least one reactive compound; and (b) at least one ignition gas, wherein the at least one ignition gas increases the ignitability of the etchant source gas as compared to the ignitability of the etchant source gas lacking the at least one ignition gas; igniting the etchant source gas via the application of a RF (radio frequency) energy source; and etching at least a portion of the at least one layer in the semiconductor wafer.

In another embodiment, the present invention relates to a method for increasing the ignition reliability of a plasma in a plasma reactor, the method comprising: supplying a source gas to the plasma reactor, the source gas comprising: (a) at least one reactive compound; and (b) at least one ignition gas, wherein the at least one ignition gas increases the ignitability of the source gas as compared to the ignitability of the source gas lacking the at least one ignition gas.

In another embodiment, the present invention relates to a method for plasma deposition of at least one layer over at least a portion of one or more underlying layers, the method comprising: placing a semiconductor wafer in a plasma reactor; supplying a deposition source gas to the plasma reactor, the deposition source gas comprising: (a) at least one reactive compound; and (b) at least one ignition gas, wherein the at least one ignition gas increases the ignitability of the deposition source gas as compared to the ignitability of the deposition source gas lacking the at least one ignition gas; igniting the deposition source gas via the application of a RF energy source; and depositing at least one layer over at least a portion of one or more underlying layers in the semiconductor wafer.

Thus, the present invention overcomes the problems associated with unreliable ignition of etch and/or deposition chemistry used in plasma reactors.

DETAILED DESCRIPTION OF THE INVENTION

Figure 1:
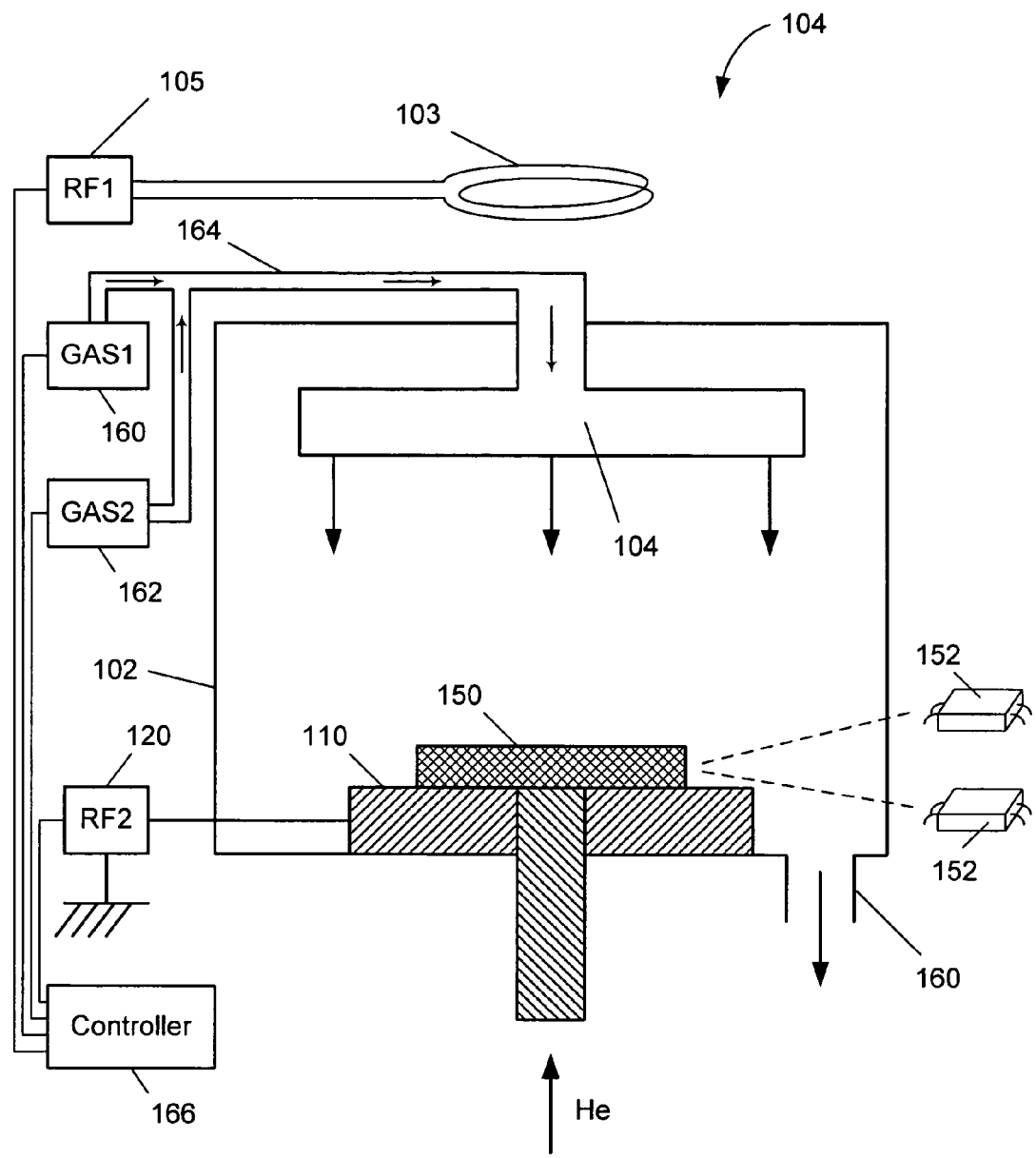
FIG. 1 is a simplified schematic diagram of an exemplary plasma reactor that may be suitably employed in a plasma etching or deposition method in accordance with the present invention.

An invention is described for increasing the reliability of the ignition of an etch chemistry in a plasma reactor. The present invention also applies to increasing the reliability of the ignition of a plasma deposition chemistry in a plasma reactor.

In one embodiment of the present invention, an etchant source gas (i.e., etch chemistry or feed gas) and/or an deposition source gas (i.e., deposition chemistry) comprises at least one reactive compound (e.g., a fluorocarbon compound) and at least one ignition gas, wherein the at least one ignition gas increases the ignitability of the etchant source gas and/or deposition source gas as compared to the ignitability of an etchant source gas and/or deposition source gas lacking at least one ignition gas. Thus, in this embodiment, the etchant source gas and/or deposition source gas is at least a two-component gas. As used in the specification and claims, the term "two-component gas" encompasses both etchant source gases and deposition source gases of the present invention which source gases contain more than two unique components, at least one of which is an ignition gas.

In another embodiment, the etchant source gas and/or deposition source gas can further include an inert gas. Thus, in this embodiment, the etchant source gas and/or deposition source gas is at least a three-component gas. As used in the specification and claims, the term "three-component gas" encompasses both etchant source gases and deposition source gases of the present invention which source gases contain more than three unique components, at least one of which is an ignition gas.

As used in the specification and claims, the term "semiconductor wafer" includes a wafer with one or more layers, at least one of which includes a semiconductor, which is later processed into a integrated circuit, micro device, micromachines, disk drive heads, gene chips, micro electromechanical systems (MEMS) and so forth.

In one embodiment, the at least one reactive compound is one or more fluorocarbon compounds selected from $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures of two or more thereof. In another embodiment, the at least one reactive compound is in a gaseous state at room temperature (25° C.).

Such compounds have at least one fluorine atom bonded to a carbon atom in place of a hydrogen atom. Some specific examples of such compounds include, but are not limited to, tetrafluoromethane ($CF_4$), trifluoromethane ($CHF_3$), difluoromethane ($CH_2F_2$), fluoromethane ($CH_3F$), hexafluoroethane ($C_2F_6$), tetrafluoroethylene ($C_2F_4$), perfluorocyclobutene ($C_4F_6$), hexafluorobutadiene ($C_4F_6$), perfluorobutene ($C_4F_8$) and octafluorocyclobutane ($C_4F_8$).

As noted above, the at least one ignition gas which when added to the etch chemistry increases the ignitability of the etch chemistry can be any gas which acts to increase the ignition rate of the etchant/deposition source gas. In one embodiment, the at least one ignition gas is selected from chlorine, chlorine-containing gases (e.g., hydrogen chloride, boron trichloride, etc.), bromine, bromine-containing gases (e.g., hydrogen bromide, etc.), or mixtures of two or more thereof.

In another embodiment, the at least one ignition gas is selected from the gases mentioned above on the basis that the at least one ignition gas does not react with any of other components in the two/three-component gases and/or any of the layers/components of the semiconductor to be processed. In this instance, the at least one ignition gas can be supplied during the entire etch and/or deposition step.

In the instance where the at least one ignition gas is reactive with one or more other components present in two/three-component gases and/or any of the layers/components of the semiconductor to be processed, the impact of this reactivity can be mitigated by stopping the flow of the at least one ignition gas to the plasma reactor prior to the plasma-on step (i.e., stopping the flow of the at least one ignition gas prior to or simultaneously upon the application of RF-power needed by the plasma reactor to conduct the desired etching or deposition step). Alternatively, the flow of the at least one ignition gas can be stopped at some point after application of the RF-power to the plasma reactor so long as the flow is stopped soon enough to ensure that little to no reaction occurs between the at least one ignition gas and any of the other components present in two/three-component gases and/or any of the layers/components of the semiconductor to be processed. In one embodiment, the flow of the at least one ignition gas is shut-off about 0.1 to about 20 seconds after the application of the RF-power to the plasma reactor, or even about 0.5 to about 10 seconds after application of the RF-power to the plasma reactor.

In the embodiment where an inert gas is present, the inert gas utilized in the plasma reactor is inert with respect to the layer being etched and to the underlying layers that are being exposed by the etching process. Given the composition of the layer to be etched and the layer or layers to be exposed, those of skill in the art can recognize and select a suitable inert gas to be supplied to the plasma reactor.

In one embodiment, the inert gas for the etch chemistry is selected from helium, argon, krypton, neon, xenon or mixtures of two or more thereof. As noted above, the inert gas is not limited thereto and can be any gas whether or not such a gas is considered chemically inert in almost all instances, so long as the gas utilized as an inert gas does not react with the layer to be etched and the layer or layers exposed by the etching process.

In the case where the present invention is utilized to facilitate ignition in plasma deposition processes, the inert gas is chosen so as not to react with the layer being deposited and any layers which are exposed prior to the deposition of the layer to be deposited.

In one embodiment, the inert gas for the deposition chemistry is selected from helium, argon, krypton, neon, xenon or mixtures of two or more thereof. As noted above, the inert gas is not limited thereto and can be any gas whether or not such a gas is considered chemically inert in almost all instances, so long as the gas utilized as an inert gas does not react with the layer to be deposited and the layer or layers which are exposed prior to deposition.

The inventive two/three-component gases may be utilized in any known plasma processing apparatuses, including those adapted for dry etching, plasma etching, reactive ion etching (RIE), inductively coupled plasma (ICP) etching, magnetically enhanced reactive ion etching (MERIE), electron cyclotron resonance (ECR), plasma deposition (e.g., PECVD) or the like.

The at least one ignition gas of the present invention can be supplied to a suitable plasma reactor at any point of the etching or deposition process. In one embodiment, the at least one ignition gas is supplied along with the other components of the two/three-component gases during at least one of the ignition and/or plasma-on steps. In another embodiment, the at least one ignition gas is supplied to the plasma reactor during the gas stabilization step. In this instance the residual gas left in the plasma reactor mixes with the other components of the etchant/deposition source gas to form the above-mentioned two/three-component gas.

In one embodiment, a plasma processing chamber is adapted for depositing at least one layer onto a substrate. The chamber includes an inlet port through which process deposition source gases are supplied to the chamber interior. A suitable RF energy source is applied to electrodes associated with the chamber to induce a plasma from the deposition source gases. The energy itself may be coupled inductively or capacitively to sustain the plasma, as is known. Species are then formed from the deposition source gas, such species being deposited on one or more exposed layers of the substrate to yield a modified or new layer. The species created from the deposition source gas may or may not react with one or more underlying layers to yield the desired deposited layer. The by-products, which may be volatile, are then exhausted through an exit port.

In another embodiment, a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the method of the present invention may be practiced in any of the above reactors, as well as other suitable plasma processing reactors. Note that the above is applicable irrespective of whether energy to the plasma is delivered through capacitively coupled parallel electrode plates, through ECR microwave plasma sources, or through inductively coupled RF sources such as helicon, helical resonators, and transformer coupled plasma. ECR and TCP (transformer coupled plasma) processing systems, among others, are readily available commercially. TCP systems are available, for example, from Lam Research Corporation of Fremont, Calif.

In one embodiment, the method of the present invention is carried out in a TCP 9600 SE plasma reactor, which is available from Lam Research Corporation, although, as mentioned above, any conventional and suitable plasma processing systems may well be employed.

FIG. 1 illustrates a simplified schematic of the TCP 9600 SE plasma reactor, including wafer 150 and integrated circuit chips 152, which are fabricated from dies cut from wafer 150 after the wafer is etched according to the inventive etch and processed in conventional post-etch steps. Referring to FIG. 1, a wafer reactor 100 includes a plasma processing chamber 102. Above chamber 102, there is disposed an electrode 103, which is implemented by a coil in the example of FIG. 1. Coil 103 is energized by a RF generator 105 via a matching network.

Within chamber 102, there is provided a shower head 104, which preferably includes a plurality of holes for releasing gaseous source materials, e.g., the etchant source gases, into the RF-induced plasma region between shower head 104 and a wafer 150. As is shown in FIG. 1, reactive gas reservoir 160 (labeled GAS1) and ignition gas reservoir 162 (labeled GAS2) are connected via supply line 164 to shower head 104. In the embodiment shown in FIG. 1, the at least one reactive gas and the at least one ignition gas are supplied independently of one another. Alternatively, the at least one reactive gas and the at least one ignition gas may be supplied together, i.e., pre-combined. In another embodiment, the gaseous source materials may also be released from ports built into the walls of the chamber itself rather than via the shower head 104 shown in FIG. 1.

The flows of the at least one reactive gas from reactive gas reservoir 160 and of the at least one ignition gas from ignition gas reservoir 162 are controlled independently via controller 166. Additionally, controller 166 is also used to control, as desired, the application of RF power from RF generators 105 and 120.

As discussed above, the flow of the at least one ignition gas can be selectively controlled in order to mitigate the impact, if any, that the at least one ignition gas has upon the etch and/or deposition process being conducted in the plasma reactor. In one embodiment, controller 166 can be programmed to stop the flow of the at least one ignition gas to the plasma reactor prior to the plasma-on step (i.e., stopping the flow of the at least one ignition gas simultaneously upon the application of RF-power needed by the plasma reactor to conduct the desired etching or deposition step). Alternatively, the flow of the at least one ignition gas can be stopped via controller 166 at some point after application of the RF-power to the plasma reactor so long as the flow is stopped soon enough to ensure that little to no reaction occurs between the at least one ignition gas and any of the other components present in two/three-component gases and/or any of the layers/components of the semiconductor to be processed. In one embodiment, the flow of the at least one ignition gas is shut-off about 0.1 to about 20 seconds after the application of the RF-power to the plasma reactor, or even about 0.5 to about 10 seconds after application of the RF-power to the plasma reactor.

Wafer 150 is introduced into chamber 102 and disposed on a chuck 110, which acts as a second electrode and is preferably biased by a RF generator 120 (also typically via a matching network). A suitable cooling gas (e.g., helium) is introduced under pressure (e.g., about 5 to about 10 Torr in one embodiment) between chuck 110 and wafer 150 to act as a heat transfer medium for accurately controlling the wafer's temperature during processing to ensure uniform and repeatable etching results. During plasma etching, the pressure within chamber 102 is preferably kept low by withdrawing gas through port 160, e.g., between about 5 to about 25 mTorr in one embodiment. A plurality of heaters (not shown in FIG. 1) may be provided to maintain a suitable chamber temperature for etching (e.g., about 70° C. in one embodiment). To provide an electrical path to ground, the chamber wall of chamber 102 is typically grounded.

It should be noted that the present invention is not limited to the above process parameters. Instead, the present invention is useful within a wide range of plasma etch/deposition process parameters. For example, the rates at the at least two and/or three component etchant/deposition source gases are supplied to the plasma reactor are from about 1 standard cubic centimeters per minute (sccm) to about 10,000 sccm, or from about 5 sccm to about 1,000 sccm, or even from about 10 sccm to about 100 sccm. In one embodiment, the two or three component gas of the present invention is supplied as a premixed gas. In another embodiment, each of the components of the two or three-component gas are supplied individually to the plasma reactor at any one of the rates mentioned above.

In one embodiment, the temperature at which plasma etching and/or deposition is conducted is from about 0° C. to about 400° C., or from about 20 to about 300° C., or from about 40° C. to about 150° C. In one embodiment, the pressure in the reactor is from about 1 mTorr to about 760 Torr, or from about 10 mTorr to about 100 Torr, or from about 20 mTorr to about 10 Torr. If applicable, the bias power used in plasma deposition according to the present invention is about 10 W to about 5000 W, or from about 50 W to about 2,500 W, or from about 100 W to about 1,000 W.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A method for etching at least a portion of at least one layer of a semiconductor wafer to expose one or more underlying layers, the method comprising:
    placing a semiconductor wafer in a plasma reactor;
    supplying an etchant source gas to the plasma reactor, the etchant source gas comprising:
        (a) at least one reactive compound; and
        (b) at least one ignition gas, wherein the at least one ignition gas increases the ignitability of the etchant source gas as compared to the ignitability of the etchant source gas lacking the at least one ignition gas;
    igniting the etchant source gas via the application of a RF energy source; and
    etching at least a portion of the at least one layer in the semiconductor wafer,
    wherein flow of the at least one ignition gas is stopped to ensure that the at least one ignition gas does not react in the etching, and wherein the at least one ignition gas is selected from chlorine, chlorine-containing gases, bromine, bromine-containing gases, or mixtures of two or more thereof.

2. The method of claim 1, wherein the at least one reactive compound comprises one or more fluorocarbon compounds selected from $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures of two or more thereof.

3. The method of claim 1, wherein the at least one reactive compound is selected from tetrafluoromethane ($CF_4$), trifluoromethane ($CHF_3$), difluoromethane ($CH_2F_2$), fluoromethane ($CH_3F$), hexafluoroethane ($C_2F_6$), tetrafluoroethylene ($C_2F_4$), perfluorocyclobutene ($C_4F_6$), hexafluorobutadiene ($C_4F_6$), perfluorobutene ($C_4F_8$) and octafluorocyclobutane ($C_4F_8$), or mixtures of two or more thereof.

4. The method of claim 1, wherein the ignition gas is supplied independently from the remaining components of the etchant source gas.

5. The method of claim 1, wherein the supply of the at least one ignition gas is shut off at or around the time application of the RF energy source to the plasma reactor is initiated.

6. The method of claim 1, wherein the supply of the at least one ignition gas is shut off from about 0.1 to about 20 seconds after application of the RF energy source to the plasma reactor is initiated.

7. The method of claim 1, wherein the etchant source gas further comprises:
    (c) at least one inert gas selected from helium, argon, krypton, neon, xenon, or mixtures of two or more thereof.

8. The method of claim 1, wherein the temperature at which plasma etching is conducted is from about 0° C. to about 400° C.

9. A method for increasing the ignition reliability of a plasma in a plasma reactor, the method comprising:
    supplying a source gas to the plasma reactor, the source gas comprising:
        (a) at least one reactive compound; and
        (b) at least one ignition gas, wherein the at least one ignition gas increases the ignitability of the source gas as compared to the ignitability of the source gas lacking the at least one ignition gas, and
    igniting the source gas via the application of a RF energy source,
    wherein flow of the at least one ignition gas is stopped to ensure that the at least one ignition gas does not react subsequent to the igniting, and wherein the at least one ignition gas is selected from chlorine, chlorine-containing gases, bromine, bromine-containing gases, or mixtures of two or more thereof.

10. The method of claim 9, wherein the at least one reactive compound comprises one or more fluorocarbon compounds selected from $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures of two or more thereof.

11. The method of claim 9, wherein the at least one reactive compound is selected from tetrafluoromethane ($CF_4$), trifluoromethane ($CHF_3$), difluoromethane ($CH_2F_2$), fluoromethane ($CH_3F$), hexafluoroethane ($C_2F_6$), tetrafluoroethylene ($C_2F_4$), perfluorocyclobutene ($C_4F_6$), hexafluorobutadiene ($C_4F_6$), perfluorobutene ($C_4F_8$) and octafluorocyclobutane ($C_4F_8$), or mixtures of two or more thereof.

12. The method of claim 9, wherein the ignition gas is supplied independently from the remaining components of the source gas.

13. The method of claim 9, wherein the supply of the at least one ignition gas is shut off at or around the application of the RF energy source to the plasma reactor is initiated.

14. The method of claim 9, wherein the supply of the at least one ignition gas is shut off from about 0.1 to about 20 seconds after application of the RF energy source to the plasma reactor is initiated.

15. The method of claim 9, wherein the source gas further comprises:
    (c) at least one inert gas selected from helium, argon, krypton, neon, xenon, or mixtures of two or more thereof.

16. A method for plasma deposition of at least one layer over at a portion of one or more underlying layers, the method comprising:
    placing a semiconductor wafer in a plasma reactor;
    supplying a deposition source gas to the plasma reactor, the deposition source gas comprising:
        (a) at least one reactive compound; and
        (b) at least one ignition gas, wherein the at least one ignition gas increases the ignitability of the deposition source gas as compared to the ignitability of the deposition source gas lacking the at least one ignition gas;
    igniting the deposition source gas via the application of a RF energy source; and
    depositing at least one layer over at least a portion of one or more underlying layers in the semiconductor wafer,
    wherein flow of the at least one ignition gas is stopped to ensure that the at least one ignition gas does not react in the depositing, and wherein the at least one ignition gas is selected from chlorine, chlorine-containing gases, bromine, bromine-containing gases, or mixtures of two or more thereof.

17. The method of claim 16, wherein the at least one reactive compound comprises one or more fluorocarbon compounds selected from $C_1$ to $C_8$ fluoro-alkanes, $C_2$ to $C_8$ fluoro-alkenes, $C_3$ to $C_8$ cyclofluoro-alkanes, $C_4$ to $C_8$ cyclofluoro-alkenes, or mixtures of two or more thereof.

18. The method of claim 16, wherein the at least one reactive compound is selected from tetrafluoromethane ($CF_4$), trifluoromethane ($CHF_3$), difluoromethane ($CH_2F_2$), fluoromethane ($CH_3F$), hexafluoroethane ($C_2F_6$), tetrafluoroethylene ($C_2F_4$), perfluorocyclobutene ($C_4F_6$), hexafluorobutadiene ($C_4F_6$), perfluorobutene ($C_4F_8$) and octafluorocyclobutane ($C_4F_8$), or mixtures of two or more thereof.

19. The method of claim 16, wherein the ignition gas is supplied independently from the remaining components of the deposition source gas.

20. The method of claim 16, wherein the supply of the at least one ignition gas is shut off at or around the application of the RF energy source to the plasma reactor is initiated.

21. The method of claim 16, wherein the supply of the at least one ignition gas is shut off from about 0.1 to about 20 seconds after application of the RF energy source to the plasma reactor is initiated.

22. The method of claim 16, wherein the deposition source gas further comprises:
   (c) at least one inert gas selected from helium, argon, krypton, neon, xenon, or mixtures of two or more thereof.

23. The method of claim 16, wherein the temperature at which plasma deposition is conducted is from about 0° C. to about 400° C.

* * * * *